US006700095B2

(12) United States Patent
Sandstrom et al.

(10) Patent No.: US 6,700,095 B2
(45) Date of Patent: Mar. 2, 2004

(54) PATTERN GENERATION SYSTEM USING A SPATIAL LIGHT MODULATOR

(75) Inventors: Torbjorn Sandstrom, Pixbo (SE); Anna-Karin Holmer, Gothenburg (SE); Ulric Lungblad, Molndal (SE); Dag Hanstorp, Savedalen (SE)

(73) Assignee: Micronic Laser Systems AB, Taby (SE)

(*) Notice: Subject to any disclaimer, the term of this patent is extended or adjusted under 35 U.S.C. 154(b) by 77 days.

(21) Appl. No.: 10/130,070

(22) PCT Filed: Apr. 10, 2001

(86) PCT No.: PCT/SE01/00793

§ 371 (c)(1),
(2), (4) Date: May 15, 2002

(87) PCT Pub. No.: WO01/79935

PCT Pub. Date: Oct. 25, 2001

(65) Prior Publication Data

US 2002/0153362 A1 Oct. 24, 2002

(30) Foreign Application Priority Data

Apr. 17, 2000 (SE) ................................. 0001409

(51) Int. Cl.⁷ .......................... B41C 1/05; B23K 26/06; B23K 26/08
(52) U.S. Cl. ................................. 219/121.73
(58) Field of Search ................... 219/121.6, 121.61, 219/121.62, 121.68, 121.69, 121.73, 121.74, 121.83

(56) References Cited

U.S. PATENT DOCUMENTS

| 4,070,681 A | * | 1/1978 | Ichikawa et al. ........... 347/255 |
| 5,448,417 A | * | 9/1995 | Adams ....................... 359/856 |
| 5,852,621 A | | 12/1998 | Sandstrom |

FOREIGN PATENT DOCUMENTS

WO         93/25387 A1      12/1993

* cited by examiner

*Primary Examiner*—Samuel M. Heinrich
(74) *Attorney, Agent, or Firm*—Harness, Dickey & Pierce, P.L.C.

(57) ABSTRACT

A system for creating a pattern on a workpiece sensitive to light radiation, such as a photomask, a display panel or a microoptical device, comprising a source for emitting light pulses in the wavelength range from EUV to IR, a spatial light modulator (SLM) having at least one modulating element (pixel), adapted to being illuminated by at least one emitted light pulse and a projection system creating an image of the modulator on the workpiece. Further, the system comprises a fast pulse detector to detect an output pulse energy of each individual pulse and produce for each said individual pulse, a signal corresponding to the output pulse energy of said individual pulse, a switch having response times in the nanosecond or sub-nanosecond range for blocking portions of each pulse, said switch being configured to be controlled by said signals from said last pulse detector, so as to control the energy output of each individual pulse to approximately a desired energy output based on the output pulse energy measurement of said individual pulse.

23 Claims, 2 Drawing Sheets

PATTERN GENERATION SYSTEM USING A SPATIAL LIGHT MODULATOR

This application is the national phase under 35 U.S.C. §371 of PCT International Application No. PCT/SE01/00793 which has an International filing date of Apr. 10, 2001, which designated the United States of America.

FIELD OF THE INVENTION

The present invention relates to printing of patterns with extremely high precision on photosensitive surfaces, such as photomasks for semiconductor devices and displays. More specifically the invention relates to a system for creating a pattern on a workpiece comprising a source for emitting light pulses in the wavelength range from EUV to IR, a spatial light modulator (SLM) having at least one modulating element (pixel), adapted to being illuminated by at least one emitted light pulse and a projection system creating an image of the modulator on the workpiece.

BACKGROUND OF THE INVENTION

It is previously known, e.g. from WO 99/45439 by the same applicant, to use a spatial light modulator (SLM) in a pattern generator. This has a number of advantages compared to the more wide-spread method of using scanning laser spots: the SLM is a massively parallel device and the number of pixels that can be written per second is extremely high. The optical system is also simpler in the sense that the illumination of the SLM is non-critical, while in a laser scanner the entire beam path has to be built with high precision. Compared to some types of scanners, in particular electro-optic and acousto-optic ones, the micromirror SLM can be used at shorter wavelengths since it is a purely reflective device. Such a pattern generator comprises a source for emitting light pulses, an SLM with modulating elements (pixels), adapted to being illuminated by the emitted light pulses and a projection system creating an image of the modulator on the workpiece.

However, a problem with using SLM in pattern generators is that for practical reasons each feature on the workpiece has to be produced by one or at least very few light pulses. Consequently, the system becomes very sensitive to flash-to-flash energy variations and time jitter. These problems are especially important in gas discharge lasers, such as in a normally used excimer laser. A conventional excimer laser has flash-to-flash energy variations of 5% and flash-to-flash time jitter of 100 ns. These variations are due to various factors such as variations in the gain medium and variations in the electrical discharge process. The duration of the laser pulse for a typical excimer laser used for lithography is about 10–20 ns and the pulse frequency is in the range of about 1,000 Hz. By using two exposures for each feature on the workpiece this problem could to some extent be alleviated, but not totally eliminated.

In conventional microlithography, i.e. wafer steppers or wafer scanners, using light flashes, such as in integrated circuit lithography, less precision of the light pulses is required, since each feature on the workpiece could normally be created by 50 light pulses or more. Consequently, the integrated exposure on each part of the workpiece area becomes less sensitive to light pulse variations. However, even in this case flash-to-flash variations are troublesome. To this end it is proposed in U.S. Pat. No. 5,852,621 to control the laser pulse energy by using a fast pulse energy detector having response time in the nanosecond or sub-nanosecond range providing an electrical signal representing pulse energy to a trigger circuit. The trigger circuit integrates the signal and triggers an electro-optic switch, such as a Pockels cell, when the integrated signal reaches a predetermined level. The operation of the electro-optic switch trims a portion of the pulse energy so that the resulting pulse energy is maintained at a consistent level.

SUMMARY OF THE INVENTION

It is therefore an object of the present invention to provide an improved SLM pattern generator for printing of precision patterns.

This object is achieved with a system according to the appended claims.

It should be noted that the invention specifically relates to printing of photomasks for semiconductor devices and displays, but also relates to direct writing of semiconductor device patterns, display panels, integrated optical devices and electronic interconnect structures. Furthermore, it can have applications to other types of precision printing such as security printing. The term printing should be understood in a broad sense, meaning exposure of photoresist and photographic emulsion, but also the action of light on other light sensitive media such as dry-process paper, by ablation or chemical processes activated by light or heat. Light is not limited to mean visible light, but a wide range of wavelengths from infrared (IR) to extreme UV.

BRIEF DESCRIPTION OF THE DRAWINGS

For exemplifying purposes, the invention will be described in closer detail in the following with reference to embodiments thereof illustrated in the attached drawings, wherein.

DESCRIPTION OF PREFERRED EMBODIMENTS

Figure 1:
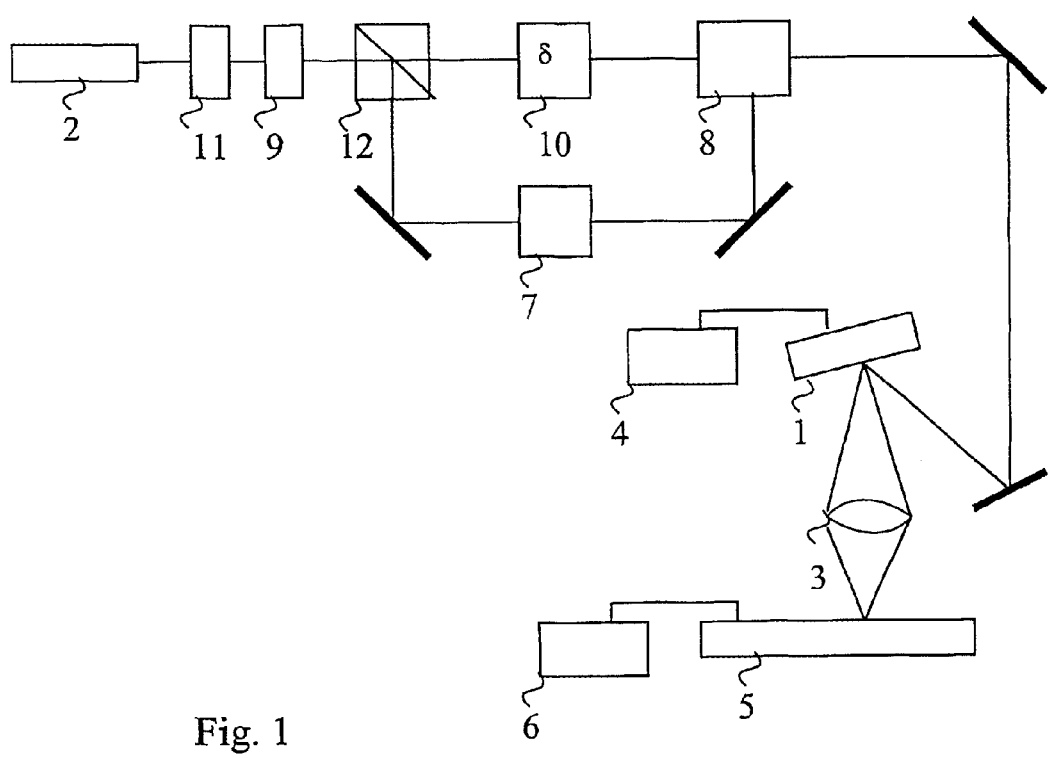
FIG. 1 is a schematic illustration of a pattern generator using an SLM according to invention.

Referring to FIG. 1, a pattern generator according to the invention comprises an SLM 1, preferably with individual and multi-value pixel addressing, an illumination source 2, an imaging optical system 3, and a hardware and software data handling system 4 for the SLM. Further, the system preferably comprises a fine positioning substrate stage 5 with an interferometer position control system 6 or the like.

The SLM 1 can be built either with micromachined mirrors, so called micromirrors, or with a continuous mirror surface on a supporting substrate so that it is possible to deform using an electronic signal. Other arrangements are however possible as well, such as transmissive or reflecting SLMs relying on LCD crystals or electrooptical materials as their modulation mechanism, or micromechanical SLMs using piezoelectric or electrostrictive actuation.

For light in the EUV range a Bragg mirror with deformable mirror elements or micro mechanical shutters could be used as an SLM.

The illumination in the pattern generator is preferably done with a KrF excimer laser giving a 10–20 nanoseconds long light flash in the UV region at 248 nanometer wavelength with a bandwidth corresponding to the natural linewidth of an excimer laser. In order to avoid pattern distortion on the substrate, the light from the excimer laser is uniformly distributed over the SLM surface and the light has a short enough coherence length not to produce laser speckle on the substrate. A beam scrambler is preferably used to achieve these two aims.

Preferably, the pattern generator has a fine positioning substrate stage with an irterferometer position control system. In one direction, y, the servo system keeps the stage in fixed position and in the other direction, x, the stage moves with continues speed. The interferometer position measuring system is used in the x-direction to trigger the exposure laser flashes to give uniform position between each image of the SLM on the substrate. When a full row of SLM images are exposed on the substrate the stage moves back to the original position in the x direction and moves one SLM image increment in the y direction to expose another row of SLM images on the substrate. This procedure is repeated until the entire substrate is exposed. The surface is preferably written in several passes in order to average out errors.

Further, the system according to the invention comprises a fast pulse detector 7 to detect an output pulse energy of each individual pulse and produce for each said individual pulse, a signal corresponding to the output pulse energy of said individual pulse. The detector is connected to a switch 8 having response times in the nanosecond or sub-nanosecond range for blocking portions of each pulse, said switch being configured to be controlled by said signals from said fast pulse detector. Hereby, the energy output of each individual pulse could be controlled to approximately a desired energy output based on the output pulse energy measurement of said individual pulse. Preferably a beam-splitter 12 is arranged ahead of the photo-detector 7, whereby only a divided part of the beam is detected. The switch could then preferably be arranged after the beams has been rejoined again, but it is also possible to arrange the switch so that it only affects a divide part of the beam.

Figure 2A:
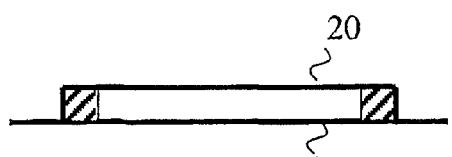
FIGS. 2a and b is a schematic representation of a micro mechanical modulator according to an embodiment of the invention, illustrating two different working conditions.
Figure 2B:
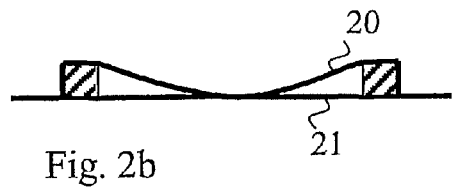

The switch in the system can for example be a micro-mechanical modulator comprising several small reflecting mirrors. The mirrors can be electrically manipulated to reflect or diffract incoming light in different directions depending on an electrical voltage applied to the individual mirrors. Such a mirror element could e.g. comprise a reflective membrane 20 with an underlying electrode 21, such as is illustrated in FIG. 2a. When a voltage is applied between the membrane and the electrode the membrane is drawn towards the electrode, such as is illustrated in FIG. 2b. By the appropriate choice of membrane shape and electrical addressing of the membranes—in relation to each other or individually—a diffracting surface can be formed by the modulator.

The membranes could for example have a stripe like shape. When all membranes are flat, i.e. when no voltage is applied to them, they form a flat reflecting surface. The modulator is arranged so that the incoming light is reflected off the flat surface into a direction coinciding with the optical axis of the following optical system. If a voltage is applied to every second membrane stripe a binary reflection grating is created. The grating diffracts the incoming light into first and higher diffraction orders. The angle of the first diffraction orders depends on the pitch of the grating and is chose so that the first and higher diffraction orders are not transmitted through the apertures of the following optical system. Thus, the modulator works like a light switch. This kind of devices are for example manufactured by Silicon Light Machines, having a switch time of about 10 nanoseconds. If the relief height of the diffracting structure is a modulus n of half the wavelength of the incoming light, n being an integer, no light is contained in the non-diffracted zeroth order, the switch thus blocking all incoming light from entering the following optical system.

The micro-mechanical modulator could be subdivided into smaller sub-areas, each sub-area being comprised of parallel mirror membrane stripes and each sub-area constituting a switch. The sub-areas could be arranged in different configurations related to each other, having all the membranes in parallel or rotated in relation to the other sub-areas. The sub-areas are controlled individually, thus making it possible to diffract part of the beam while letting the rest of the beam pass undeflected. Thus, the total transmission of the modulator can be set in an analog fashion, even with binary (on/off) driving of each element. To cut off the beam completely, all the sub-areas are addressed and are thus made diffracting.

It is also possible to make each membrane a diffracting structure. Since just the middle portion of the membrane is attracted to the electrode, each membrane creates a periodic structure in itself. By proper design of the membranes, a surface filling array can be created (see FIGS. 3a–d), which creates a dark surface when all elements are addressed. Thus, the transmission of the modulator could be set by the relative number of addressed membranes or membrane cluster.

Another way of controlling the relative amount of undiffracted to diffracted light would be to control the relief depth of the grating. This could be done if the depth to which each membrane is drawn by the attraction to the electrode could be made continuously dependent on the applied voltage. Thus, the grating relief height would be controlled by the value of the applied voltage, the voltage value thus controlling the amount of light in the zeroth order in relation to the first and higher diffraction orders.

Figure 3A:
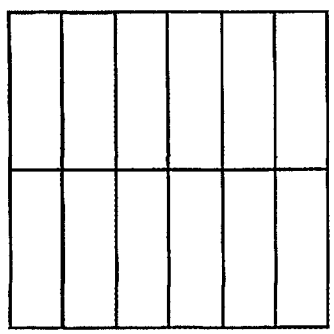
FIGS. 3a–d is an illustration of different preferred arrangements of stripe formed micro mechanical modulators are illustrated.
Figure 3C:
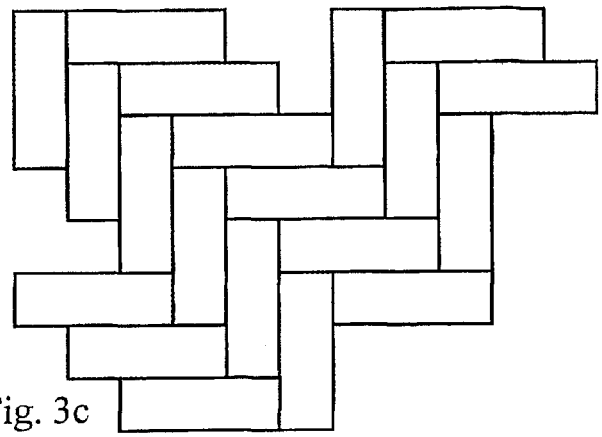
Figure 3B:
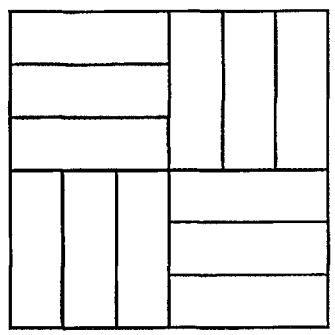
Figure 3D:
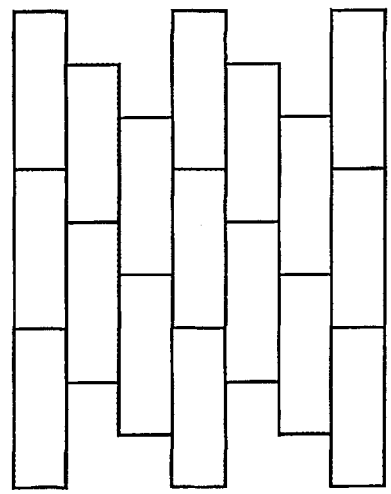

In FIG. 3a a first preferred arrangement of elongate micro mechanical modulators is illustrated. In this embodiment the elongated modulators are arranged side by side in columns. In FIG. 3b a second preferred arrangement of elongate micro mechanical modulators is illustrated. In this embodiment the elongated modulators are arranged in groups of parallel modulators, but the groups being arranged in orthogonal relation to each other. In FIG. 3c a third preferred arrangement of elongate micro mechanical modulators is illustrated. In this embodiment the elongated modulators are arranged in groups of two modulators being perpendicular arranged in an angle, and several such groups being arranged displaced adjacent to each other. In FIG. 3d a fourth preferred arrangement of elongate micro mechanical modulators is illustrated. In this embodiment the elongated modulators are arranged in parallel lines of modulators, being arranged after each other in the length direction, but the lines being displaced relative to each other.

However, the switch could also be an electro-optic switch 8, such as a Pockels cell. In this case the output of the photo detector 7 is fed to an electro-optic cell trigger which integrates the signal and compares the integrated signal to a predetermined cutoff value corresponding to the desired pulse energy. When the cutoff value is reached the trigger produces a trigger signal which activates a high voltage in the Pockels cell 3. One such suitable Pockels cell is available from Energy Compression Corporation, USA, or Gsänger, Germany. Application of high voltage to Pockels cell shifts the polarization of laser beam by up to 90 degrees so that part of the beam traversing the Pockels cell could be rejected by a polarising filter.

The system according to the invention increases the pulse to pulse stability of the pulse energy by cutting the pulse at a preset value of integrated pulse energy. The means for cutting the pulse is a very fast switch, e.g. an electro optic switch, such as a Pockels cell, or a micro mechanical modulator as described above. If the level of pulse energy for which the system is set to cut off the pulse is changed, the switch will obviously cut the pulse a little earlier or a little later, depending on the change of pulse energy setting. Considering the very short pulse duration of about 10–20 nanoseconds, it may be difficult to change the time of clipping considerably due to the speed of the switch. Thus, the system would work with the same time constants regardless of selected transmitted energy dose. The transmission of the switch can be changed continuously both for Pockels cell switches and for switches using the micro mechanical modulator described above.

The transmission of a Pockels cell switch could be controlled by the polarization of the incident light. It could also be controlled by the voltage applied to the Pockels cell, thus controlling the amount of polarization rotation of the cell and adjusting the amount of light transmitted by the second polarizer of the Pockels cell switch. Considering the high power used in Pockels cells it might be convenient to use two Pockels cell switches in conjunction, the first for on/off clipping and the other for smaller transmission modulation.

To facilitate the clipping of the very short pulse, a pulse stretcher 9 could be used before the detector. Thus, the pulse duration would be increased making the limited switch time of the following pulse trimmer less critical and allowing for more accurate clipping of the pulse.

The pulse stretcher 9 could e.g. comprise two parallel mirrors with reflection coefficients less than one. The two mirrors then constitute an optical resonator. The light is coupled in through the first mirror. The limited transmittance of the mirrors causes the light to make several round-trips within the resonator, some of the light passing through the second mirror at each passage. The pulse duration is thus increased. The pulse duration will depend on the photon lifetime of the resonator. The photon lifetime depends on the reflectivity of the mirrors and the resonator length.

In order to have enough time to detect the pulse energy and to control the switch accordingly it may be necessary to use a delay unit 10, placed between the detector and the switch, to delay the pulse. This could be achieved by arranging reflectors in the beam path to increase the path length. An increased path length of 1 meter results in a delay of the pulse of about 3–4 ns. The delay time is preferably also adjustable. However, other types of delay means could be used as well.

For high precision pattern generation systems using SLMs, the required average beam pulse power is very low, normally about 10–100 mW, to be compared to the normal pulse energy power used in microlithography, which is normally in the range 10–20 W. A problem with using such high beam power is that the components being placed after the laser are exposed to high pulse energies and likely to be damaged. In the inventive system it therefore preferred to use a light source with restricted output power. Alternatively, a conventional laser or the like could be used, whereby an attenuator 11 could be placed ahead of the pulse detector, for attenuating the pulse energy of each individual pulse.

Time jitter may also be controlled by the inventive system by cutting both the pulse ends in a controlled manner, leaving a precisely controlled middle part. To this end it is possible to use two switches, of the type described above, in series; one to be opened a controlled time period after the emission of the pulse, and another to be closed a controlled time period after the opening of the switch.

Although the pattern generation system above has been described with reference to several particular embodiments, it is to be appreciated that various adaptations and modifications may be made. For example, functionally equivalent components could be used to replace several of the above described components of the system, such as other types of lasers or light sources, such as flash discharge tubes or, for EUV, plasma light sources, other types of delay circuits, other types of switching means, other types of detectors, such as photo multiplicators etc. Therefore, the invention is only to be limited by the appended claims and their legal equivalents.

What is claimed is:

1. A system for creating a pattern on a workpiece sensitive to light radiation, such as a photomask, a display panel or a microoptical device, comprising a source for emitting light pulses in the wavelength range from EUV to IR, a spatial light modulator (SLM) having at least one modulating element (pixel), adapted to being illuminated by at least one emitted light pulse and a projection system creating an image of the modulator on the workpiece, characterized in that it further comprises a fast pulse detector to detect an output pulse energy of each individual pulse and produce for each said individual pulse, a signal corresponding to the output pulse energy of said individual pulse, a switch having response times in the nanosecond or sub-nanosecond range for blocking portions of each pulse, said switch being configured to be controlled by said signals from said fast pulse detector, so as to control the energy output of each individual pulse to approximately a desired energy output based on the output pulse energy measurement of said individual pulse.

2. A system according to claim 1, wherein said switch is controlled to reduce the pulse to pulse jitter and enhance the pulse to pulse stability of the emitted light pulses.

3. A system according to claim 1, wherein said switch is further controlled in accordance with the required illumination on the workpiece.

4. A system according to claim 1, wherein it further comprises a beam splitter for dividing the light pulse in at least two parts, and the switch being adapted to control the energy output of only one of those parts, and a rejoining unit for subsequently rejoining the pulse parts.

5. A system according to claim 1, wherein said light pulse source is a laser, and preferably an excimer laser.

6. A system according to claim 1, wherein said fast pulse energy detector is a photo-diode.

7. A system according to claim 1, wherein said switch is an electro optic switch, and preferably comprising a Pockels cell and at least one polarizing beam splitter.

8. A system according to claim 1, wherein said switch comprises a micro mechanical modulator.

9. A system according to claim 8, wherein the micro mechanical modulator comprises an array of controllable reflecting elements.

10. A system according to claim 9, wherein the reflecting elements comprises an elongate reflecting surface.

11. A system according to claim 10, wherein the reflecting elements are arranged with essentially parallel elongation directions.

12. A system according to claim 10, wherein the reflecting elements are arranged with at least two different elongation directions, said two elongation directions having an angle there between, and preferably being essentially orthogonal.

13. A system according to claim 9, wherein the reflecting elements are electrically controllable.

14. A system according to claim 8, wherein the micro mechanical modulator comprises at least one displaceable reflective membrane.

15. A system according to claim 1, further comprising an optical delay unit.

16. A system according to claim 1, wherein the switch is configured to cut the pulse at a desired value of the integrated pulse energy.

17. A system according to claim 1, wherein the switch is configured to alter the transmission properties to be used during each individual pulse.

18. A system according to claim 1, wherein it further comprises a pulse stretcher, being placed ahead of the pulse switch, for extending the pulse duration of each individual pulse.

19. A system according to claim 1, wherein each written feature on the workpiece is written as a superposition of a small number of projected images, and each image is created by less than four and preferably one light pulses.

20. A system according to claim 1, wherein the spatial modulator is a two-dimensional array of modulating elements with time-multiplexed loading of the values to the modulating elements and storage of the loaded value at each element.

21. A system according to claim 1, wherein the spatial light modulator comprises an array of micromechanical elements, and preferably an array of micromirrors.

22. A system according to claim 1, wherein it further comprises a pulse energy attenuator being placed ahead of the pulse detector, for attenuating the pulse energy of each individual pulse.

23. A system according to claim 1, comprising a second switch controlled to be initially closed and to be opened a controlled time period after the emission of the pulse in order to provide a precise control of the starting end of the pulse.

* * * * *